(12) United States Patent
Headrick et al.

(10) Patent No.: US 12,721,025 B2
(45) Date of Patent: Aug. 25, 2026

(54) FORCE-BALANCED MENISCAL DISPENSERS FOR DEPOSITING CRYSTALLINE LAYERS, AND METHODS OF PRINTING CRYSTALLINE PATTERNED FEATURES

(71) Applicant: The University of Vermont and State Agricultural College, Burlington, VT (US)

(72) Inventors: Randall L. Headrick, Burlington, VT (US); Richards Galt Miller, III, Burlington, VT (US)

(73) Assignee: The University of Vermont and State Agricultural College, Burlington, VT (US)

( * ) Notice: Subject to any disclaimer, the term of this patent is extended or adjusted under 35 U.S.C. 154(b) by 331 days.

(21) Appl. No.: 18/694,692

(22) PCT Filed: Sep. 20, 2022

(86) PCT No.: PCT/US2022/044062
§ 371 (c)(1),
(2) Date: Mar. 22, 2024

(87) PCT Pub. No.: WO2023/049090
PCT Pub. Date: Mar. 30, 2023

(65) Prior Publication Data

US 2024/0397806 A1 Nov. 28, 2024

Related U.S. Application Data

(60) Provisional application No. 63/247,605, filed on Sep. 23, 2021.

(51) Int. Cl.
*H10K 71/13* (2023.01)
*H10K 71/15* (2023.01)

(52) U.S. Cl.
CPC ............ *H10K 71/13* (2023.02); *H10K 71/15* (2023.02)

(58) Field of Classification Search
None
See application file for complete search history.

(56) References Cited

U.S. PATENT DOCUMENTS 7,351,283 B2 4/2008 Headrick
9,444,049 B2 9/2016 Headrick
(Continued)

OTHER PUBLICATIONS

Richard Mélissa et al., "Large-scale patterning of [pi]-conjugated materials by meniscus guided coating methods." Advances in Colloid and Interface Science, Elsevier, NL, vol. 275, Nov. 22, 2019 (Nov. 22, 2019), XP086033346.
(Continued)

*Primary Examiner* — Anthony Ho
(74) *Attorney, Agent, or Firm* — Downs Rachlin Martin PLLC

(57) ABSTRACT

Dispensers for dispensing solutions, such as solutions containing a crystallizable component and solvent(s), onto substrates in a controlled manner. In some embodiments, a dispenser of the present disclosure includes an elongated slot and corresponding slot opening that cooperate with a substrate so that a solution forms a meniscus between the dispenser and the substrate. The dispenser further includes a force-balancing reservoir containing wetting structures that interact with the solution to balance forces, for example, that would cause the solution to flow out of the slot when such flow is not desired. Methods of writing crystalline features, such as features of semiconductor devices, onto a substrate are also disclosed. In some embodiments, methods of the present disclosure involve strategically locating, on the substrate, regions that are either hydrophobic or hydrophilic
(Continued)

to the relevant solution to define feature regions where the features will form.

15 Claims, 8 Drawing Sheets

(56) References Cited

U.S. PATENT DOCUMENTS

| | | | |
|---|---|---|---|
| 2004/0072364 | A1 | 4/2004 | Tisone et al. |
| 2006/0094119 | A1 | 5/2006 | Ismagilov et al. |
| 2008/0138927 | A1 | 6/2008 | Headrick |
| 2015/0194605 | A1 | 7/2015 | Headrick |

OTHER PUBLICATIONS

International Search Report and Written Opinion dated Feb. 28, 2023 in connection with PCT/US2022/044062 filed Sep. 20, 2022.
Giri et al., "High-Mobility, Aligned Crystalline Domains of TIPS-Pentacene with Metastable Polymorphs Through Lateral Confinement of Crystal Growth." Advanced Materials, Adv Mater. 2014, 26, 487-493.

100
1D,1E,1F
Φ
Φ
108M
104
104I
104W
FA_R
112
108
108L
1B,1C
1B,1C
1D,1E,1F
FA_S
116O

W_S
116(1), 116O(1)
116
108M
L_S
108CL
116D(1)
116(2),116O(2)
L_S
108Dd
FA_S
108L
116D(2)
L_S
116(3), 116O(3)
108O 108M
108Dd
108CL
Δ
FA_S
108L
108Dd'

Wr
104I'
104BW(1)
104C(1)
104,104(1)
104W(1), 120

Wr
104IS(2)
104(2)
104W(2)
H_r

104(3)
104W(3)

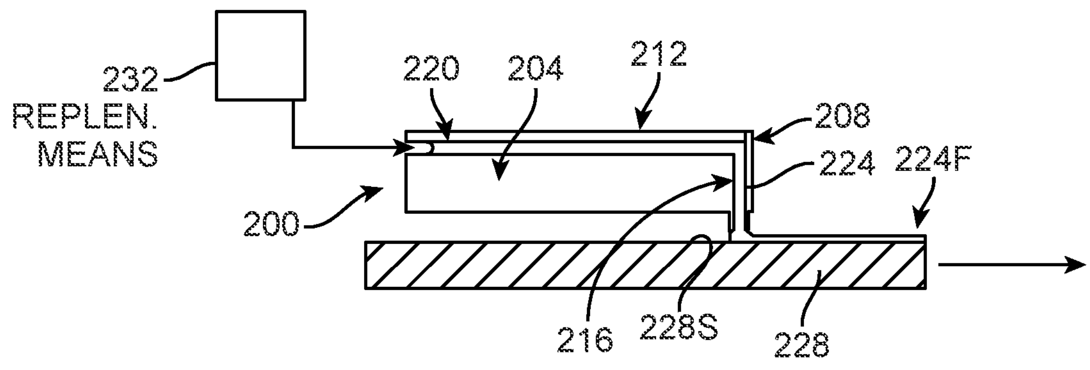
FIG. 2A
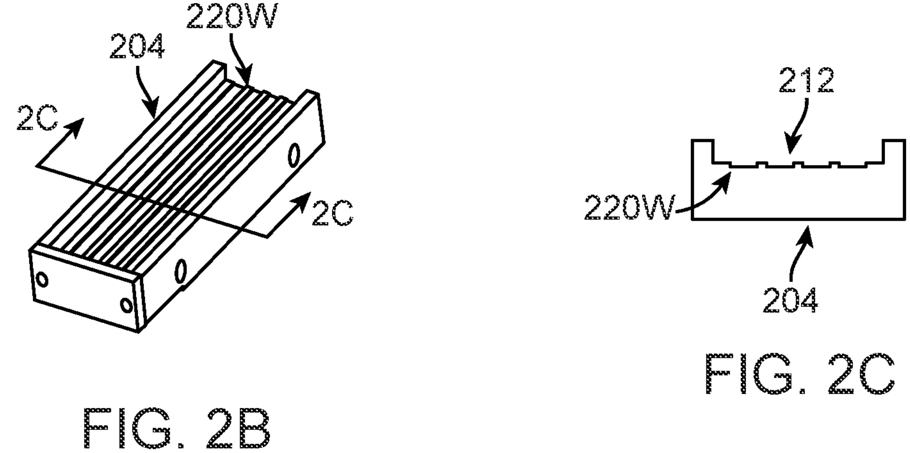
FIG. 2B
FIG. 2C
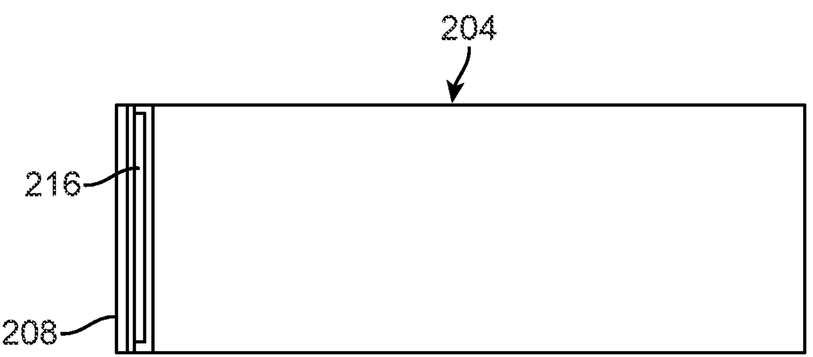
FIG. 2D

FORCE-BALANCED MENISCAL DISPENSERS FOR DEPOSITING CRYSTALLINE LAYERS, AND METHODS OF PRINTING CRYSTALLINE PATTERNED FEATURES

RELATED APPLICATION DATA

This application claims the benefit of priority of U.S. Provisional Patent Application Ser. No. 63/247,605, filed Sep. 23, 2021, and titled "Methods of Forming Patterned Crystalline Layers on a Substrate, and Apparatuses Therefor," which is incorporated by reference herein in its entirety.

GOVERNMENT RIGHTS

This invention was made with government support under 1307017, 1701774 and 1918723 awarded by the National Science Foundation. The government has certain rights in the invention.

FIELD OF THE DISCLOSURE

The present disclosure generally relates to the field of semiconductor fabrication. In particular, the present disclosure is directed to force-balanced meniscal dispensers for depositing crystalline layers, and methods of printing crystalline patterned features.

BACKGROUND

Organic semiconductor thin films have potential applications in a variety of fields, including organic field-effect transistors (OFETs), organic light emitting diodes (OLEDs), electroluminescent displays, low-cost photovoltaics, radio-frequency (RF) identification tags, sensors, and wearable computers. Thin films deposited from solution by high throughput processes (generally, >1 mm/s) generally have relatively small crystalline grain size and, therefore, are adversely affected by the properties of grain boundaries. As a result, such films typically have lower electronic carrier mobility and larger charge trap densities compared to films with larger crystalline grain size and are thus less useful for many electronic applications. For example, conventional methods of depositing organic semiconductor thin films based on vapor deposition routinely produce materials that have domain sizes smaller than 10 microns. Observers close to the electronics industry anticipate that organic microelectronics will eventually find applications in handheld and wearable devices since they can utilize flexible and light-weight materials. However, a number of issues need to be addressed in the following areas:

1) low cost, high throughput methods to produce thin film materials;
2) methods to produce patterned thin films through direct printing; and
3) methods to produce higher quality materials composed of large crystalline domains.

Consequently, it is desirable for manufacturers to be able to make high-quality organic films having crystalline domains several orders of magnitude larger than conventionally practicable. It is also desirable for manufacturers to be able to achieve patterned thin films where certain predetermined feature regions of a substrate are coated with an organic semiconductor thin film with a grain size that is comparable to or larger than the dimensions of individual patterned feature areas.

SUMMARY OF THE DISCLOSURE

In one implementation, the present disclosure is directed to a dispenser for dispensing, along a deposition direction, a solution to a surface when movement occurs between the dispenser and the surface along the deposition direction and when the solution forms a meniscus between the dispenser and the surface. The dispenser includes a dispensing slot having a slot opening immediately adjacent to the surface when the dispenser is in use, the slot opening having a length at least nominally perpendicular to the deposition direction and a width at least nominally parallel to the deposition direction, wherein the length of the slot opening is at least 2 times the width of the slot opening and the slot opening is continuous and unobstructed along the length of the slot opening; and a force-balancing reservoir fluidly communicating with the dispensing slot along the length of the slot opening of the slot and designed and configured to hold a portion of the solution during use of the dispenser, the force-balancing reservoir containing a plurality of wetting features deployed to allow the solution to flow out of the slot opening when movement exists between the dispenser and the solution in the dispensing direction; and keep the solution from flowing out of the slot opening when no movement exists between the dispenser and the surface in the dispensing direction.

In another implementation, the present disclosure is directed to a method of printing features onto a substrate using a precursor solution containing a depositable material dissolved in a solvent, wherein each feature has an in-plane size and an in-plane shape and is composed of the depositable material after the solvent leaves the feature. The method includes providing a substrate having a printing region containing a plurality of feature regions surrounded by non-feature regions, wherein the method has a printing direction along the substrate; the printing region has a width perpendicular to the printing direction; the feature regions define the locations of the crystalline features; ones of the feature regions are spaced from one another both along the printing direction and perpendicular to the printing direction; each feature region has a hydrophilic surface that is hydrophilic to the precursor solution and is sized and shaped to match, respectively, the in-plane size and the in-plane shape of the corresponding crystalline feature; and each feature region being defined by feature boundaries formed between the hydrophilic surface and a hydrophobic surface that surrounds the hydrophilic surface and that is hydrophobic to the precursor solution; and moving a meniscus of the precursor solution, in contact with the printing region the entirety of the width of the printing region, along the printing direction so as to deposit a portion of the solution onto the hydrophilic surfaces of the feature regions and to not deposit any of the solution on the hydrophobic surface.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein:

FIG. 2A is a longitudinal cross-sectional view of an example embodiment of an FBM dispenser of the present disclosure;

FIG. 2B is an isometric view of the body of the FBM dispenser of FIG. 2A;

FIG. 2C is a cross-sectional view as taken along line 2C-2C of FIG. 2B, showing the wetting channels and cover plate;

FIG. 2D is an enlarged bottom view of the FBM dispenser of FIG. 2A;

DETAILED DESCRIPTION

Figures 1A, 1B, 1C, 1D, 1E, 1F:
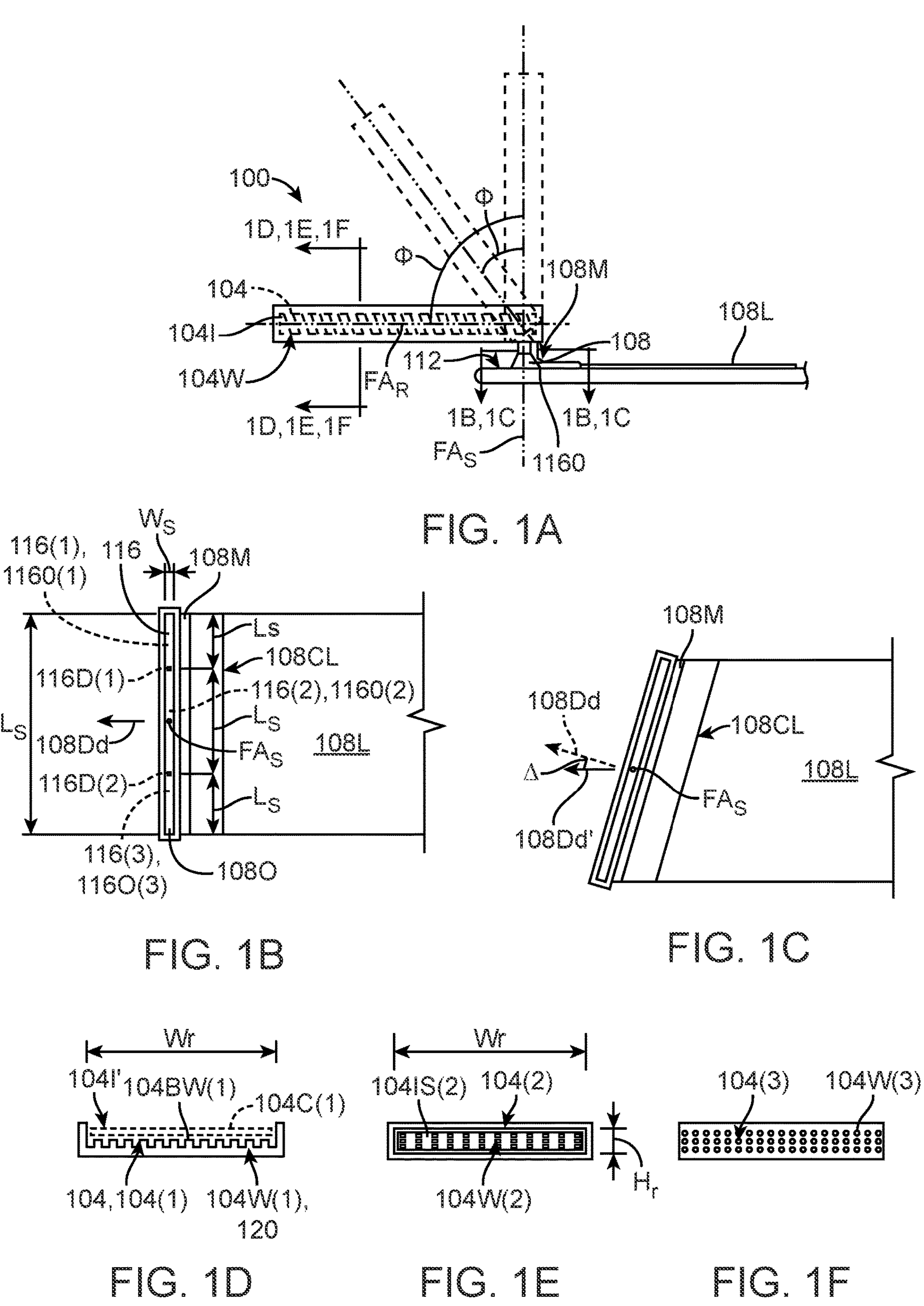
FIG. 1A is a side view of a force-balancing meniscal (FBM) dispenser made in accordance with the present disclosure.
FIG. 1B is an enlarged cross-sectional view as taken along line 1B-1B of FIG. 1A, showing the slot of the FBM dispenser.
FIG. 1C is an enlarged cross-sectional view as taken along line 1C-1C of FIG. 1A, showing the slot of the FMB dispenser in an orientation skewed relative to the orientation shown in FIG. 1B.
FIG. 1D is an enlarged cross-sectional view as taken along line 1D-1D of FIG. 1A, showing an example in which the reservoir of the FBM dispenser is an open-channel reservoir.
FIG. 1E is an enlarged cross-sectional view as taken along line 1E-1E of FIG. 1A, showing an example in which the reservoir of the FBM dispenser is a closed-channel reservoir and the wetting structures are provided by an insert structure inserted into the reservoir.
FIG. 1F is an enlarged cross-sectional view as taken along line 1F-1F of FIG. 1A, showing an example in which the reservoir of the FBM dispenser is a closed-channel reservoir and the volume of the reservoir is defined by the volume of the wetting structures.

In some aspects, the present disclosure is directed to force-balanced meniscal (FBM) dispensers, or simply "dispensers," for dispensing a solution to a surface when the dispenser and/or the surface are moving relative to one another but not when there is no movement between the dispenser and the surface. The word "meniscal" in the compound descriptor "force-balanced meniscal" is directed to the property of a dispenser of the present disclosure that during deposition the dispensed solution forms a meniscus with the surface, or at least a hydrophilic (relative to the solution) portion thereof. Details of meniscal-type dispensers relative to the formation of a meniscus in the context of organic-semiconductor precursor solutions can be found, for example, in U.S. Pat. Nos. 7,351,283 and 9,444,049, respectively, issued on Apr. 1, 2008, and Sep. 13, 2016, and titled "SYSTEM AND METHOD FOR FABRICATING A CRYSTALLINE THIN STRUCTURE" and "METHODS FOR FORMING ONE OR MORE CRYSTALLINE LAYERS ON A SUBSTRATE" and U.S. Patent Application Publication No. 2008/0138927 published on Jun. 12, 2008, and titled "SYSTEMS AND METHODS FOR FABRICATING CRYSTALLINE THIN STRUCTURES USING MENISCAL GROWTH TECHNIQUES", which are incorporated herein by reference for their teachings on meniscus geometry, other meniscal properties, and crystal growth from menisci, as noted below. As described below in detail, the term "force-balanced" in the above compound descriptor is directed to the property of a dispenser of the present disclosure that when movement exists between the dispenser and the surface, the relative movement causes the solution to be drawn out of the dispenser so as to deposit solution on the surface but when no relative movement exists, the solution neither flows out of the dispenser nor is drawn back into the dispenser, at least not to a degree that the solution loses contact with the surface. Thus, there is a force-balancing of sorts as between the dispenser and the solution, including any hydrophilic-attraction forces between the solution and the deposition surface. This force-balancing can result in improved control of the deposition of the solution and, consequently, improve control of the formation of the resulting deposited layer, for example, an organic-semiconductor layer or a hybrid organic-inorganic-semiconductor layer, that forms from the deposited solution.

In some aspects, the present disclosure is directed to printing shaped crystalline features onto a surface using a precursor solution to the crystalline layer and providing hydrophilic (to the precursor solution) feature regions sized and shaped to match the desired crystalline features. In some embodiments, the providing of the hydrophilic features may be accomplished forming a hydrophobic (to the precursor solution) mask on the surface or using a template sheet overlayed onto the surface, which may or may not be hydrophobic. In some embodiments, an FBM dispenser of the present disclosure may be used to dispense the precursor solution, while in some embodiments, other techniques, such as the techniques disclosed in any of the patent documents incorporated by reference above, can be used to apply the precursor solution. The foregoing and other aspects of the present disclosure are described below in detail by way of several nonlimiting examples and instantiations.

Throughout the present disclosure and the appended claims, the term "about" when used with a corresponding numeric value refers to ±20% of the numeric value, typically ±10% of the numeric value, often ±5% of the numeric value, and most often ±2% of the numeric value. In some embodiments, the term "about" can mean the numeric value itself.

General FBM Dispenser Configurations

Referring now to the drawings, FIGS. 1A and 1B provide a high-level overview of an example FBM dispenser 100 made in accordance with the present disclosure. In this example, the dispenser 100 includes a force-balancing reservoir 104 (or simply "reservoir") that contains a solution 108 for dispensing onto a surface, here, surface 112, via an elongated dispensing slot 116 (or simply "slot")(FIG. 1B). In this example, the solution 108 is a precursor solution for forming a crystalline layer 108L on the surface 112 (FIG. 1A), which is hydrophilic to the solution so that the solution forms a meniscus 108M between the dispenser 100 and the surface before a crystallizable component within the solution crystalizes at a contact line 108CL to form the crystalline layer. Examples of crystalline layers composed of organic and hybrid organic-inorganic semiconductor material and examples of precursor solutions for forming such crystalline layers are described below. In addition, details concerning the mechanism of crystal growth at the contact line 108CL can be found, for example, in any of the patent documents incorporated by reference above. In the context of the dispenser 100, the particular composition of the solution 108 is not critical; rather, the interactions of the solution with the surface 112 and the dispenser are important to achieving the desired force-balancing characteristics of the dispenser.

The force-balancing characteristics of the example FBM dispenser 100 are achieved by providing the reservoir 104 with wetting features 104W that are either structural elements located within the reservoir or have an aggregate volume that effectively define the reservoir itself, or a combination of both. Generally, the wetting features 104W have surfaces (not illustrated) that are hydrophilic to the solution 108 and are designed, configured, and located so as to cause forces within the solution 108 that act to counterbalance forces, such as self-weight of the solution and surface tension and other forces relating to the meniscus 104M, that would, without the presence of the wetting features, cause the solution to flow out of the dispenser 100 at rates higher than needed or desired. For example, during deposition and formation of the crystalline layer 108L, without the wetting features 104W, the solution 108 would flow out of the dispenser 100 at a rate faster than the rate needed for proper deposition and formation, and, when deposition is not occurring when there is not any motion between the dispenser 100 and the surface 112, without the wetting features, the solution would flow out of the dispenser when no flow is desired. It is also noted that the wetting features 104W can be tailored so that the slot 116 dispenses the solution 108 at different flow rates along the length of the slot, if differing flow rates are desired.

From a functional perspective, the wetting features 104W need not take any particular form(s) as long as they perform the necessary force-balancing function discussed above. However, those skilled in the art will readily appreciate that some forms of the wetting features 104W will be easier, and therefore less expensive, to execute than other forms. Consequently, practicality and/or cost may be driving factors for designing and providing the necessary wetting features 104W. It is noted that the wetting features 104W, when wetted by the solution 108, are considered part of the reservoir 104 regardless of where they may be located by virtue of them holding some portion of the solution. For example, wetting features 104W that may appear to be located in the slot 116 are nonetheless part of the reservoir 104.

It is noted that in some embodiments all of the counterbalancing forces needed to achieve the desired force-balancing goals are nominally or solely provided by the wetting features 104W and not any other types of forces, such as forces due to vacuum and/or suction. The word "nominally" in the immediately preceding sentence is provided to account for secondary forces that may come into play as a natural consequence of non-force-balancing features of the dispenser 100, such as wetting/capillary forces, that may develop within the slot 116 or conventional solution-delivery channel(s)(not shown) that feed the solution 108 to the slot. A distinction is that such secondary forces, if present, cannot achieve the necessary force-balancing without the presence of the wetting features 104W, which are intentionally designed to provide the dispenser 100 with the proper force-balancing for a given application of the dispenser. Typically, the reservoir 104 is in fluid communication with the surrounding environment and same environment as the deposition of the crystalline layer 108L that occurs on the surface 112. Thus, both the reservoir 104 and the deposition are subjected to the same ambient pressure (e.g., atmospheric pressure) such that a global suction force cannot exist as between a solution inlet 104I (FIG. 1A), 104I' (FIG. 1D) to the reservoir 104 and the slot 116.

The form(s) of the wetting features 104W will generally require consideration of a variety of design parameters, including, but not limited to: wetting characteristics of the solution 108, the density of the solution, the amount of the solution in the slot 116, the transverse cross-sectional dimensions of the slot (i.e., slot length, Ls, and slot width, Ws (FIG. 1B)), the angle, ϕ, between the flow axis, FAs, of the slot and the aggregate flow axis, FAr, of the reservoir 104, whether or not the reservoir is open along an upper side, and the size of the meniscus 108M, among others and in any suitable subcombination, depending on a particular design. It is noted that the aggregate flow axis FAr of the reservoir is effectively the axis that is parallel to the aggregate flow of the solution 108 within and/or through the reservoir 104.

Example forms that the wetting features 104W can have include, but are not limited to, channels formed in one or more interior walls of the reservoir, island-like structures formed on one or more walls of the reservoir, column-like structures extending from one wall and, in some case, joining to an opposite wall, internal walls within the boundary wall of the reservoir (e.g., forming serpentine, zig-zag, or circuitous passageways within the reservoir, tube-like structures within the reservoir or otherwise functionally forming an aggregate reservoir composed of the sum of the internal volumes of the tube-like structures, and an open-pore structure within the reservoir or otherwise functionally forming an aggregate reservoir composed of the open volume of the open-pore structure, among others, singly or in any suitable combination with one another.

The crystalized layer 108L has a deposition direction 108Dd (FIG. 1B) along which the size of the deposited crystalized layer is increased as one, the other, or both of the dispenser 100 and surface 112 are moved relative to the other during deposition. As mentioned above, the slot 116 has a length Ls and a width Ws, as illustrated in FIG. 1B, with the length Ls being nominally perpendicular to a deposition direction, 108Dd, and the width Ws being nominally parallel to the deposition direction 108Dd. Referring to both FIGS. 1B and 1C, the term "nominally" in the immediately preceding sentence is provided to account for the possibility that the actual deposition direction 108Dd' may be at some non-zero skew angle, Δ, relative to design deposition direction 108Dd relative to which the length Ls and width Ws are oriented. Typically, the skew angle Δ will be so close to zero that it is negligible.

The slot 116 has an undivided opening 116O proximate to the surface 112 during use of the dispenser 100, and the area of the opening is defined by the length Ls and the width Ws. In this example, the slot 116 is undivided, so the length Ls is equal to the overall length of the slot. However, in other embodiments the overall slot 116 may be divided into multiple segments, for example, segments 116(1) to 116(3) by dividers 116D(1) and 116D(2)(FIG. 1B), each of which has a corresponding undivided length Ls and a corresponding undivided opening 116O(1) to 116O(3). In some embodiments, the ratio of the length Ls to the width Ws is 2:1 or greater, 5:1 or greater, 10:1 or greater, 20:1 or greater, 50:1 or greater, 100:1 or greater, 500:1 or greater, or 1000:1 or greater, among other ranges. In some embodiments, including embodiments having the length Ls to the width Ws ratios just noted, the width Ws of the slot 116 at the opening 116O may range from about 100 microns to about 500 microns for relatively lower viscosity solutions and from about 500 microns to about 2500 microns for relatively higher viscosity solutions, among others. Those skilled in the art will readily understand how to tune the width Ws of the slot 116 for a particular application, for example according to the viscosity of the solution 108, without undue experimentation. In this embodiment, the opening 116O is free of any obstruction at the front face of the portion of the dispenser 100 immediately adjacent to the slot 116. In some embodiments, the opening 116O may have a depth (not shown) as measured from the front face of the opening to the portion of the wetting features 104W closest to the front face in a range of about 0 mm to about 10 mm, or more. However, at larges depths, self-weight of the solution 108 could become more of a factor in designing proper wetting features 104W. Depending on the depth, the slot 116 may optionally include one or more dividers 116D spaced from one another along the length Ls of the slot.

Referring to FIGS. 1D and 1B, the width, Wr, of the reservoir 104 in this example is equal to the length Ls of the slot 112. However, in some embodiments the width, Wr, of the reservoir 104 in this example may be either less than or greater than the length Ls of the slot 112, depending on the design at issue. In any of these cases, it should be appreciated that there is a many-to-one relationship between the number of the wetting features 104W and the single slot 112 as a whole, or, if the slot is divided along its overall length into multiple segments by one or more dividers, such as the segments 116(1) to 116(3) divided by dividers 116D(1) and 116D(2), between the number the wetting features associated with any one of the resulting slot segments and that particular slot segment itself. If a slot is divided into segments, each segment may have any of the slot width Ws to slot/segment width Ls as noted above.

With particular reference to FIG. 1D, this figure illustrates an example of the reservoir 104 being an open-channel reservoir 104(1), with the wetting features 104W(1) being located toward the bottom of the reservoir. In this example, the wetting features 104W(1) are illustrated as being open channels (e.g., straight, serpentine, zig-zag, etc.)(collectively illustrated at 120) formed in the bottom wall 104BW (1) of the reservoir 104(1). In some embodiments, the open-channel reservoir 104(1) may be closed using a suitable closure 104C(1), such as a piece of glass or other transparent material, piece of plastic or piece of metal, among other things. In some embodiments that include the closure 104C(1), the closure may include its own wetting features (not shown), which may complement or replace the wetting features 104W(1) shown.

FIG. 1E illustrates an example of the reservoir 104 being a closed channel reservoir 104(2), with the wetting structures 104W(2) being distributed across the full height Hr and width Wr of the reservoir. In some examples, the wetting structures 104W(2) may be formed by an open-pore foam or an open-pore sintered structure or be a plurality of straight, serpentine, zig-zag, etc., closed channels, among others. In this example, the wetting structures 104W(2) are provided in an insert structure 104IS(2) that is inserted into the reservoir 104(2). In this example, the wetting structures 104W(2) are shown as occupying the full height Hr of the reservoir 104(2). However, in other embodiments, the wetting structures 104W(2) do not extend the full height Hr of the reservoir 104(2).

FIG. 1F illustrates an example of the reservoir 104 being a closed channel reservoir 104(3), with the volume of the reservoir being the aggregate of the volume defined by the wetting structures 104W(3) themselves. Generally, the reservoir 104(3) of FIG. 1F can be distinguished from the reservoir 104(2) of FIG. 1E in that the reservoir of FIG. 1F is not separately formed relative to the wetting structures 104W(3) and, therefore, does not have a volume for holding the solution 108 that may be greater than the aggregate volume provided by the wetting structures. Rather, the volume of the reservoir 104(3) is the volume defined by the wetting structures 104W(3) themselves. In some examples, the wetting structures 104W(3) may be formed by an open-pore foam or an open-pore sintered structure or be a plurality of straight, serpentine, zig-zag, etc., closed channels, among others, and such wetting structures can be provided by additive manufacturing techniques (e.g. 3D printing) or subtractive manufacturing techniques (e.g., milling, drilling, electrical discharge machining, etc.).

Example FMB Dispenser Embodiment

FIGS. 2A to 2D illustrate an example instantiation 200 (hereinafter "dispenser 200" or "FBM dispenser 200") of an FBM dispenser 100 of FIGS. 1A to 1F. Referring to FIG. 2A, in this instantiation, FBM dispenser 200 includes a main body 204, and end piece 208, and a removable cover plate 212. FIGS. 2B to 2D illustrate various details not seen or not well-illustrated in FIG. 2A, and the reader should refer to each of these additional figures as needed. The end piece 208 and the main body 204 cooperate to form a slot 216, and the cover plate 212 and the main body cooperate to form the reservoir 220. In some embodiments, the end piece 208 may be made removable so as to be swappable for an end piece (not shown) that provides the slot 216 with one or more different characteristics, such as different length, different width(s), different number of dividers (if any), and/or more or fewer wetting features that contribute to the volume of the reservoir 220. As best seen in FIGS. 2B and 2C, the reservoir 220 is formed by a plurality of wetting channels 220W (wetting features 104W of FIG. 1A). FIG. 2A illustrates the FBM dispenser 200 dispensing a solution 224 onto a surface 228S of a substrate 228 to form a liquid film 224F on that surface. When the solution 224 is a precursor solution containing a crystallizable component, that component can crystallize, and the solvent can evaporate or otherwise be removed, to form a crystalline layer (not shown). As those skilled in the art will readily appreciate, the substrate 228 can be any suitable flexible or rigid substrate, and the liquid film 224F can be provided for any suitable purpose, such as forming a crystalline layer and/or one or more semiconductor layers of a semiconductor device, such as a field-effect transistor (FET), diode, solar cell, or other photoconducting layer, etc. The surface 228S of the substrate 228 is hydrophilic, at least in the regions wherein the liquid film 224F is desired. In some embodiments, the cover plate 212 may be transparent so that a user can view the contents of the wetting channels 220W, and correspondingly the amount of the solution 224 in the reservoir 220, for example, to determine when solution needs to be added to the reservoir. As seen in FIG. 2D, the slot 216 in this embodiments does not include any internal dividers or other internal structures. Leaving the reservoir 220 open to atmospheric pressure allows for simple replenishment of the solution 224 within the reservoir using any suitable replenishment means 232, such as an automated replenishment system or a manual replenishment system. The materials of construction of each of the main body 204, end piece 208, and cover plate 212 may be any material(s) suitable for the particular application.

During use of the FBM dispenser 200, the solution 224 is introduced into the reservoir 220 and then flows into the slot 216 under its own weight. The deposition of the thin liquid film 224F is illustrated in FIG. 2A. As the dispenser 200 and the substrate 228 move relative to one another, the solution 224 is pulled out of the slot 216 into the thin liquid film 224F by capillary forces. This force-balanced solution-delivery technique has several advantages, including: (i) when the coating or printing process changes speed, the delivery rate automatically adjusts to the new process speed, and (ii) during patterned coating when a hydrophobic portion of the surface is being coated, the delivery is able to momentarily cease without the solution 224 flowing out of the slot 116. Thus, a conventional system that includes a conventional pumping arrangement is disadvantaged relative to an FBM dispenser of the present disclosure, even if the disadvantage is mitigated with active control and feedback on the delivery rate, because these measures, which can be complex and costly, are unnecessary with the passive delivery design of an FBM dispenser of this disclosure. Both of the advantages (i) and (ii) are explained in more detail below under the heading "Example Patterning Methods".

Example FBM Dispenser Deployments

In some embodiments, methods of the present disclosure that use an FBM dispenser of the present disclosure, such as FBM dispenser 100 of FIG. 1A and FBM dispenser 200 of FIG. 2A, involve deposition from a liquid solution comprising an organic or hybrid organic-inorganic semiconductor material dissolved in an organic solvent. Such a solution is often colloquially referred to as "electronic ink." For example, 6,13-Bis(triisopropylsilylethynyl) pentacene (TIPS-pentacene) can be dissolved in toluene up to about 5 wt % at room temperature. In some embodiments, it is desirable to coat the solution over a broad area. Typically, a strip is coated, with the strip having a width that can range from 1 mm up to at least 1 meter or even larger when an FBM dispenser of the present disclosure is constructed commensurately. The details of the process referred to as "lateral crystallization" are described in the patent documents incorporated by reference above.

The regime of more general interest for high-throughput deposition is the high-speed regime above the critical speed that divides two coating regimes, as described in U.S. Pat. No. 9,444,049 incorporated by reference above. For example, the critical speed for TIPS-pentacene solutions in toluene at room temperature is about 1 mm/s during deposition by a pen writer or other similar means. Both of the regimes are considered to be within the capillary coating region of operating parameters. For convenience, in this disclosure the lower-speed regime is referred to as "Regime 1" and the higher-speed regime as "Regime 2". In Regime 1, the crystallization occurs very close to the contact line between the liquid meniscus and the surface being coated, while in Regime 2, the solution is initially coated as a liquid layer that dries to a crystalline film at an appreciable distance from the meniscus and therefore there is normally no well-defined contact line. However, the high-speed Regime 2 is more difficult to control, since it depends critically on the drying pattern of the liquid thin film. It is important to design a process that mitigates this uncontrolled drying in order to achieve large grain crystalline thin films at high throughput, and an FBM dispenser of the present disclosure is central to such a process.

Figure 3:
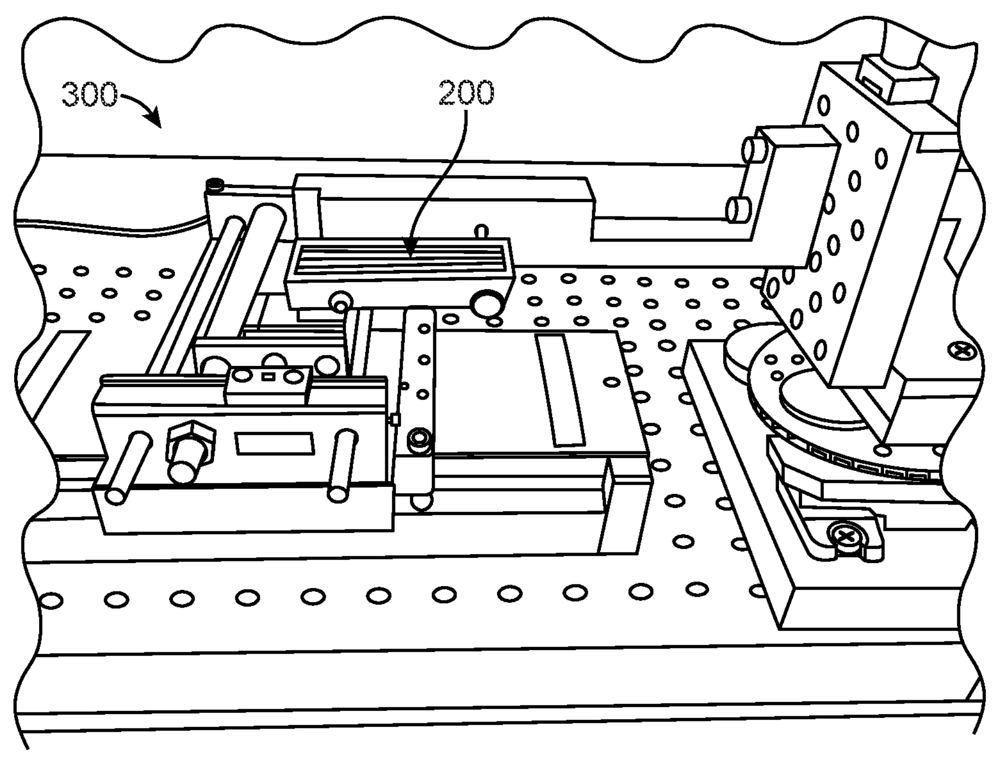
FIG. 3 is a perspective view of the FBM dispenser of FIG. 2A-2D mounted in a linear patch coater.
Figure 4A:
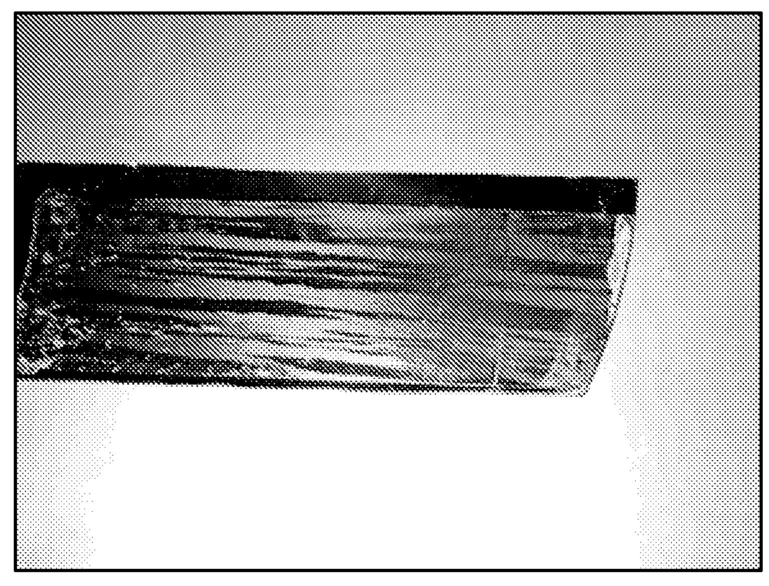
FIG. 4A is a photograph of a sample crystalline layer written using the linear patch coater of FIG. 3 in which the crystalline layer is illuminated with polarized light.
Figure 4B:
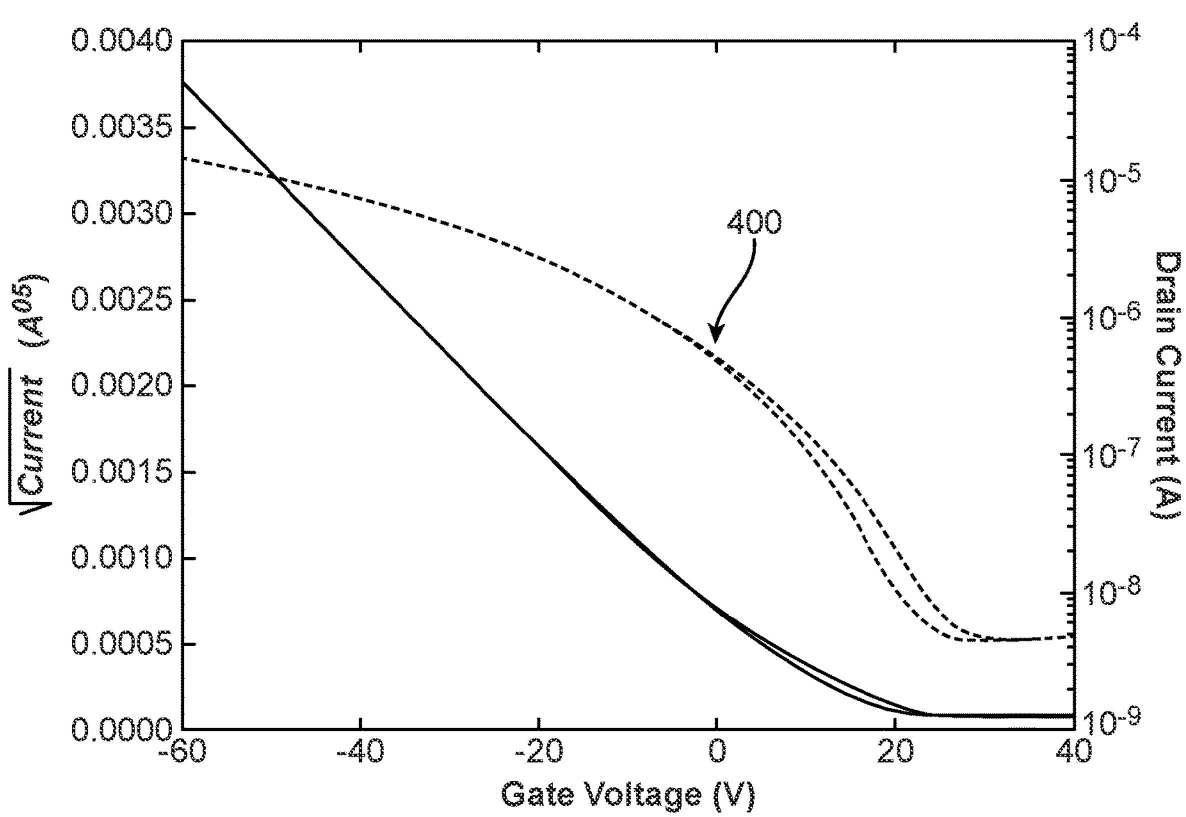
FIG. 4B a graph of a transfer curve of a field-effect transistor (FET) made using the linear patch coater of FIG. 3.
Figure 5:
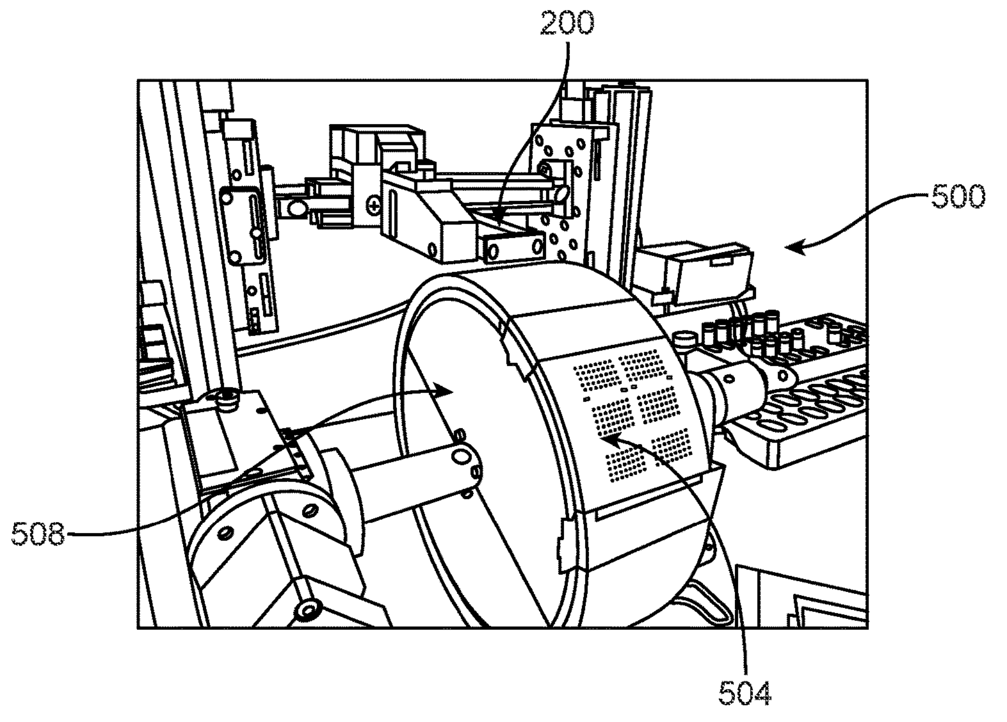
FIG. 5 is a perspective view of the FBM dispenser of FIGS. 2A-2D mounted in a roll coater.

The FBM dispenser 200 of FIGS. 2A to 2D has been tested on several coating devices, specifically a linear patch coater 300 as shown in FIG. 3 and a roll coater 500 as shown in FIG. 5. Results for the linear patch coater 300 operating in Regime 1 (0.05 mm/s deposition rate) to produce 25.4-mm-wide strips (equal to the length of the slot) of crystalline thin films of between 50 mm and 125 mm long is illustrated by FIG. 4A, which shows a portion of one of the strips made. FIG. 4A is a photograph of one of the produced 25.4-mm-wide samples illuminated with polarized light, showing that in Regime 1 at the 0.05 mm/s deposition rate, a very large grain size—more than 25.4 mm along the writing direction (perpendicular to the 25.4-mm-width samples)—was obtained. Indeed, the largest grains in this sample extended nearly the length of the 125 mm sample along the writing direction. It is hypothesized that the improvement in grain size along the writing direction is evidently a result of scaling up the width of the slot to 25.4 mm from prior art pen-writers having either round capillaries with a diameter of 1 mm or rectangular capillaries with a width of 5 mm. In these cases, crystalline grains grow in from the edges of the strip during deposition. Thus, the improvement appears to be due to minimizing the edge effects where new grains nucleate and propagate in from the edges of the thin film strip. FIG. 4B shows a transfer curve 400 for an organic or hybrid organic-inorganic FET (not shown, but see FIG. 6A for the structure of the FET) with the semiconductor layer formed using the FBM dispenser 200 of FIGS. 2A to 2D mounted in the linear patch coater 300 of FIG. 3. As seen in FIG. 4B, the charge carrier mobility found is characteristic of TIPS-pentacene with large crystalline grains.

Figure 6A:
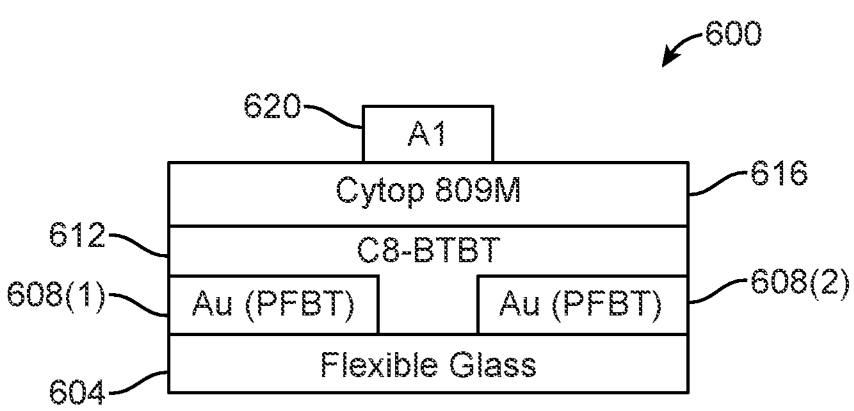
FIG. 6A is a diagram illustrating the structure of each of a plurality of field-effect transistors (FETs) made using the roll coater of FIG. 5.

FIG. 6A illustrates the FET structure 600 of FETs made using the roll coater 500 of FIG. 5. As seen in FIG. 5, a templated glass substrate 504, templated for forming the semiconductor layers of the FETs, is shown affixed to the roller 508 of the roll coater 500. As seen in FIG. 6A, the FET structure 600 was fabricated on a flexible glass substrate 604 with a pair of gold contacts 608(1) and 608(2) formed on the glass substrate. A semiconductor layer 612 of C8-BTBT with large crystalline grains was deposited onto the gold contacts 608(1) and 608(2) and the glass substrate 604 between the two gold contacts. A dielectric gate layer 616 of Cytop 809M was deposited onto the semiconductor layer 612, and an aluminum gate electrode 620 was formed thereon above the space between the two gold contacts 608(1) and 608(2). Writing conditions using the roll coater 500 of FIG. 5 in fabricating the FETs having the FET structure 600 of FIG. 6A were 25 mm/s at 60° C. with a 1.5 weight % C8-BTBT solution and a 1:1 ratio of Cytop 809m and Cytop 100 series solvent (AGC Inc., formerly Asahi Glass Co. Ltd.). The transistor yield was 85% functioning, and the mean carrier mobility of the functioning transistors was 1.1 cm2/V–s. With this as background, results for the roll coater 500 of FIG. 5 operating in Regime 2 are shown in FIGS. 6B and 6C.

Figure 6B:
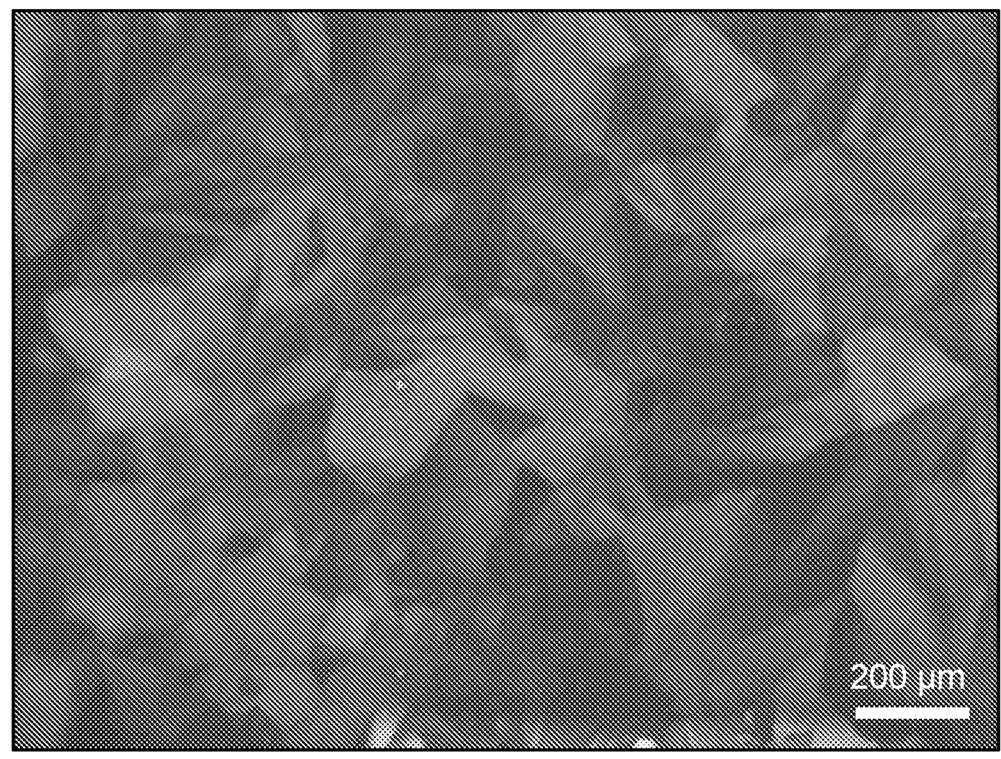
FIG. 6B is a polarized optical microscope image of a C8-BTBT thin film on a glass substrate produced with writing conditions of 25 mm/s at 60° C. from a 1.5 wt % C8-BTBT-toluene solution.
Figures 6C, 7:
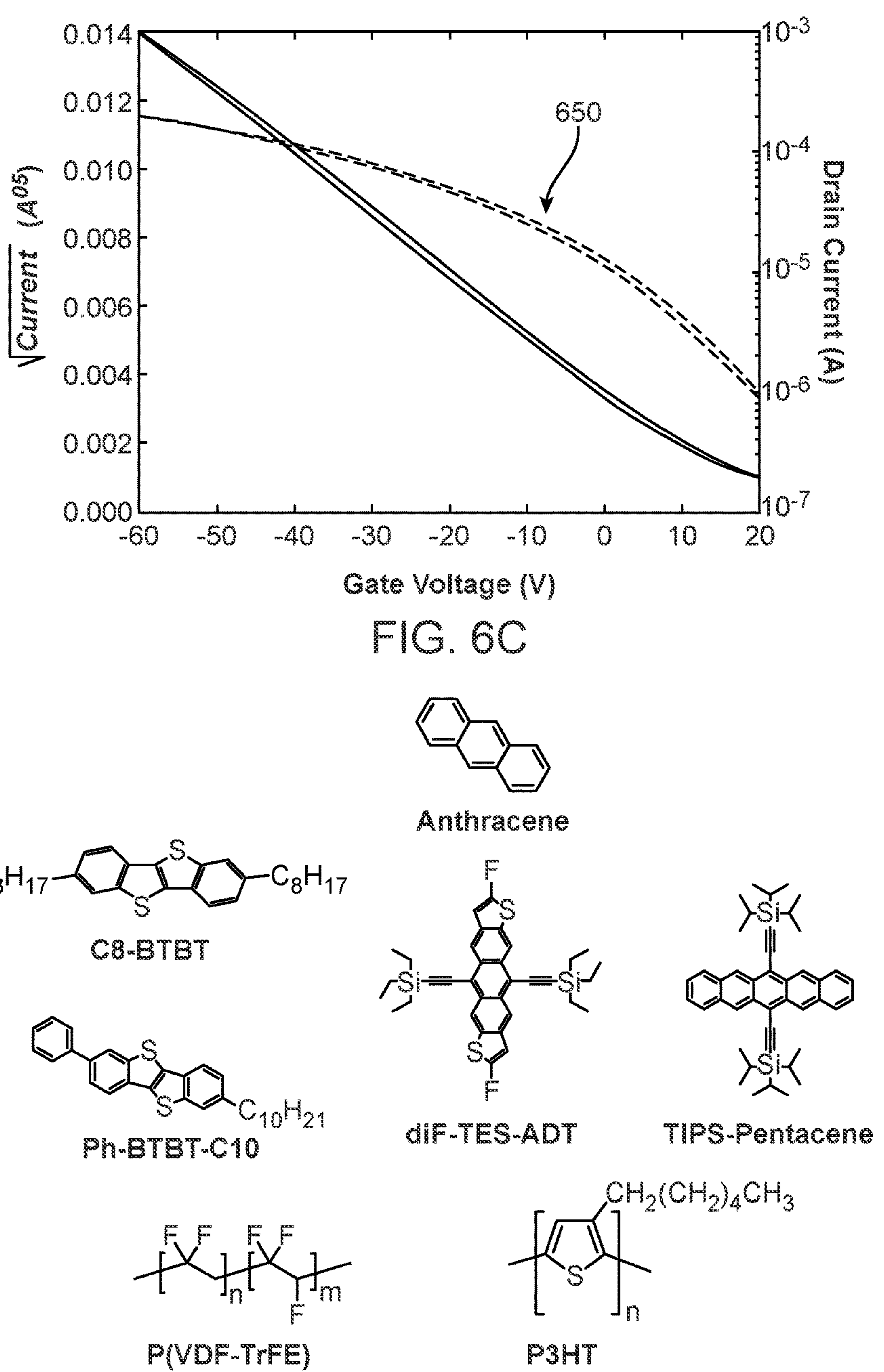
FIG. 6C is a graph of a transfer curve of one of the FETs made using the roll coater of FIG. 5.
FIG. 7 is a diagram of molecular structures of selected semiconductor and dielectric molecules.

FIG. 6B shows a polarized optical microscope image of the C8-BTBT thin film of the semiconductor layer 612(FIG. 6A). The grain size is larger than would normally be observed for the speed of 25 mm/s since the substrate temperature is held at 60° C. Although heating the substrate can shift the critical speed to higher velocity, it is apparent from the grain morphology that the deposition conditions correspond to Regime 2 because the grains are not elongated along the coating direction. Thus, the observation of large crystalline grains is not due to shifting the critical speed higher. Instead, it is due to crystallization from a transient liquid-crystalline (LC) phase. This effect is characterized as a thin film that is initially coated as a liquid solution, but that does not crystallize directly, but instead it passes through a transient LC phase. The nucleation rate of the crystalline phase controls the final grain size and the grain morphology. This effect is known to occur in a class of molecules based on the BTBT molecular core that have a liquid crystalline phase at elevated temperatures, although it should be emphasized that the effect occurs for substrate temperatures where the crystalline phase is the stable phase, not the transient LC phase. FIG. 6C shows an example of a transfer curve 650 from one of the FETs having the FET structure 600 of FIG. 6A, with C8-BTBT as the semiconductor layer 612, from which the estimated charge carrier mobility can be extracted.

Example Materials for Semiconductor Applications

When an FBM dispenser of the present disclosure, such as the dispenser 100 of FIG. 1A or the dispenser 200 of FIG. 2A, is deployed for use in creating organic and/or hybrid organic-inorganic semiconductor films, any one or more of a number of organic and hybrid organic-inorganic semiconductor molecules can be used. Classes of such molecules include: (I) simple poly-aromatic hydrocarbons (PAHs) such as anthracene; (II) PAHs with added side groups to increase solubility in organic solvents and to influence the crystalline packing, such as TIPS-pentacene, 2,8-difluoro-5,11-bis(triethylsilylethynyl) anthradithiophene (diF-TES-ADT), 2,7-dioctyl[1]benzothieno[3,2-b][1]benzothiophene (C8-BTBT), and 2-decyl-7-phenyl[1]benzothieno[3,2-b][1]benzothiophene (Ph-BTBT-C10); (III) polymers such as poly(3-hexylthiophene)(P3HT) and poly(vinylidene fluoride-co-trifluoroethylene) [P(VDF-TrFE)], and (IV) hybrid organic-inorganic molecules, such as molecules of a hybrid perovskite (e.g., a lead-halide perovskite ($CH_3NH_3PbI_3$, for example)), among others. It is noted that P(VDF-TrFE) is a dielectric material, and the others are semiconducting. The molecular structures of some of these example molecules are shown in FIG. 7.

Anthracene is the only material listed as Class 1, since it is the easiest to crystallize and typically forms the largest crystalline grain size when coated from solution. Good results are obtained for Class II, although special methods are needed to obtain very large grain size, as described in this invention disclosure. Within class II, there are exceptional cases, such as the materials with BTBT cores that have LC phases that can appear as transient phases during solution deposition under some conditions, such as during deposition on heated substrates. Another exception is Rubrene (not shown in FIG. 7). To the inventors' knowledge, large grain crystalline thin films of rubrene have not been obtained via solution coating methods. Polymeric materials (Class III) typically exhibit limited crystallinity and orientational alignment along the coating direction.

Example Patterning Methods

Semiconductor devices, such as FETs and diodes, etc., and portions thereof, can be made by depositing one or more precursor solutions of organic or hybrid organic-inorganic semiconducting material(s) and/or organic or hybrid organic-inorganic dielectric material(s) using a meniscal deposition technique, such as the dipping technique of U.S. Pat. No. 7,444,049, incorporated by reference above, or a technique using an FBM dispenser, such as the FBM dispenser 100 of FIG. 1A or the FBM dispenser 200 of FIG. 2A, among others. Such a process generally involves, for each layer of the devices deposited using such technique, providing a substrate having patterned feature regions that are hydrophilic to the precursor solution, with regions surrounding the pattered regions, or non-feature regions, being hydrophobic to the precursor solution. As discussed below in more detail, the precursor solution will not deposit onto the hydrophobic non-feature regions but will deposit onto the hydrophilic patterned feature regions, and the crystallizable component of the precursor solution will crystalize therein with high shape-fidelity.

The hydrophilic patterned feature regions may be defined in any suitable manner. For example, the hydrophilic patterned feature regions may be defined by providing the hydrophobic non-feature regions using any suitable technique, such as by blanket coating a hydrophilic layer with a hydrophobic layer, patterning the hydrophobic layer, and then etching away the patterned feature regions of the hydrophobic layer to reveal hydrophilic material underneath the hydrophobic layer. As another example, the surface of hydrophilic layer upon which the precursor solution is to be deposited may be treated in a patterned manner to make the hydrophilic layer hydrophobic in regions outside of the hydrophilic patterned regions where the precursor solution is desired to be deposited. As a further example, a removable and/or reusable hydrophobic template sheet having appropriately patterned apertures can be overlayed onto or otherwise applied to a hydrophilic surface of a substrate.

As a detailed example, a method of defining hydrophilic patterned feature regions involves treating a hydrophobic surface with a hydrophobic monolayer, such as octadecyltrichlorosilane (OTS) or another self-assembled monolayer. The pattern can be created by several means, such as by a microcontact stamp or by photolithography. The exact method is not critical, although this particular example creates the pattern by photolithography, which is accomplished through the following general steps: (i) spin coating a positive photoresist onto the surface to be coated; (ii) exposing the positive photoresist to ultraviolet light through a shadow mask; (iii) dissolving the exposed part of the photoresist using a developer solution; (iv) treating the newly-uncovered part of the surface with a hydrophobic self-assembled monolayer; and (v) removing the remaining photoresist. The patterned feature regions in the final removing step (v) have the properties of the underlying substrate, which is hydrophilic. Thus, the mask pattern is transferred into photoresist is used to create a molecular template on the original surface comprising complementary patterns of hydrophilic and hydrophobic regions that define, respectively, the feature regions and non-feature regions.

Figure 8A:
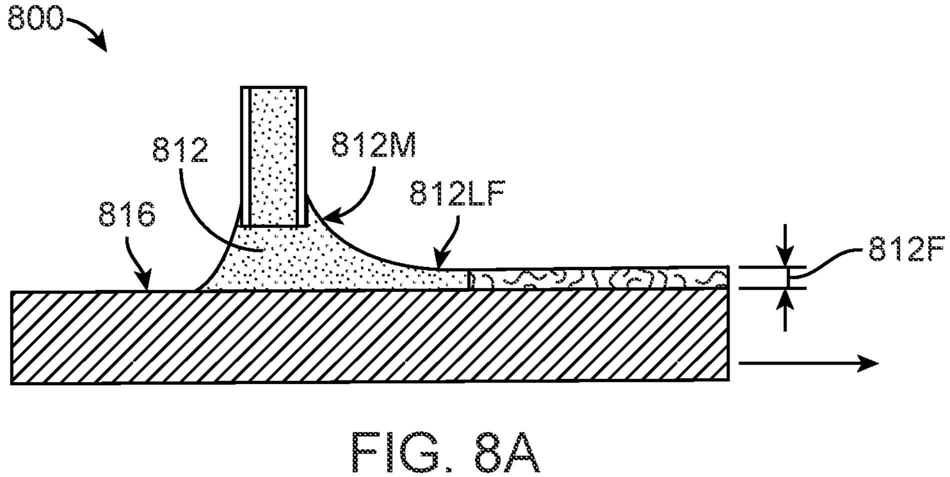
FIG. 8A is a diagram illustrating a meniscus of an FBM dispenser of the present disclosure formed on a hydrophilic surface.
Figure 8B:
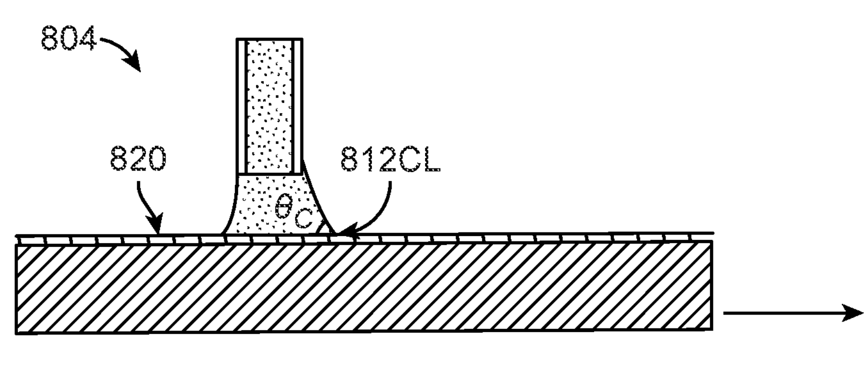
FIG. 8B is a diagram illustrating a meniscus of an FBM dispenser of the present disclosure formed on a hydrophobic surface.
Figure 8C:
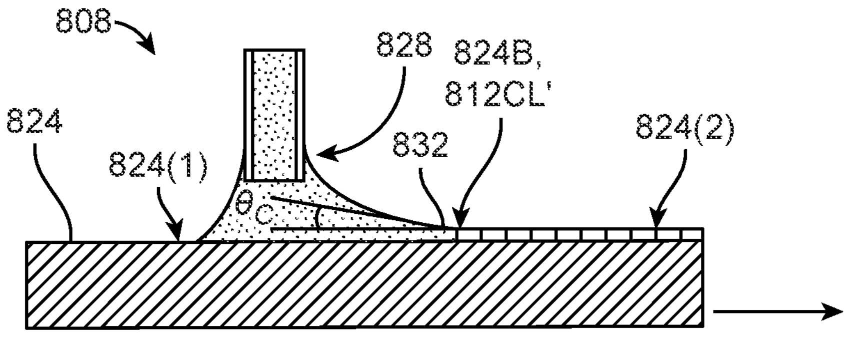
FIG. 8C is a diagram illustrating a meniscus of an FBM dispenser of the present disclosure after transitioning from a hydrophobic surface to a hydrophilic surface and showing the pinning of the contact line at the transition between the hydrophobic and hydrophilic surfaces.

FIGS. 8A to 8C show a series of schematic diagrams 800, 804, 808, respectively, that illustrate how patterning is achieved by controlling the hydrophobic/hydrophilic interaction between a liquid precursor solution and the surface on which patterned features are desired. FIG. 8A illustrates coating a precursor solution 812 onto an untreated hydrophilic surface 816 to form a crystalline film 812F. The coating occurs as long as the contact angle θc (FIGS. 8B and 8C) of the meniscus 812M is small enough. However, although this description in terms of contact angle θc is an adequate description in Regime 1, in Regime 2 there is no well-defined contact line as there is in FIG. 8B at 812CL. Instead, an elongated thin liquid film 812LF known as the "dynamic meniscus" is observed. The thin liquid film 812LF subsequently dries by solvent evaporation and transforms to the crystalline solid thin film 812F, as shown in FIG. 8A.

FIG. 8B shows the case of a hydrophobic surface 820. In this case, the surface tension force is reduced, the contact angle θc is increased, and there is no significant dynamics meniscus. As a result, no solid thin film is produced. FIG. 8C illustrates the more complex case of a patterned surface 824 having a hydrophilic region 824(1) and a hydrophobic region 824(2). Here, the trailing contact line 812CL' is pinned at the boundary 824B between the hydrophilic and hydrophobic regions 824(1) and 824(2), which leads to the meniscus 828 being dynamically stretched. As a result, a thin film 832 is deposited only in the hydrophilic region. The film 832 can be a crystalline solid film if there is a well-defined contact line (Regime 1) or it can be a liquid thin film that subsequently crystallizes, possibly by transforming through one or more transient phases before reaching the final crystalline state (Regime 2). As seen in FIG. 8C, the film 832 is pinned at the boundary 124B between the hydrophobic and hydrophilic regions 824(2) and 824(1).

Patterns have been used in a variety of different ways, such as to define surface patterns during either wet or dry etching by inhibiting the etching in the part of the surface protected by the self-assembled monolayer. In prior art, significant attention has been paid to creating surface patterns by etching methods, which can be classified as subtractive methods. In methods of the present disclosure, a crystalline thin film is created by an additive method using solution coating. As noted above, coating occurs in hydrophilic regions but not in hydrophobic regions due to reduced wetting of the solution. Feature fabrication using patterned coating methods of the present disclosure is highly unique and desirable relative to prior art because most scalable high-throughput coating methods, such as conventional slot-die coating, are designed to coat the surface completely over a broad strip, for example, at least 1 mm wide. In contrast, methods disclosed herein can additively create fully patterned semiconducting and other layers, and over relatively wide areas of the substrate on which the relatively small feature regions are predefined prior to coating.

Figures 9A, 9B, 10A, 10B, 10C:
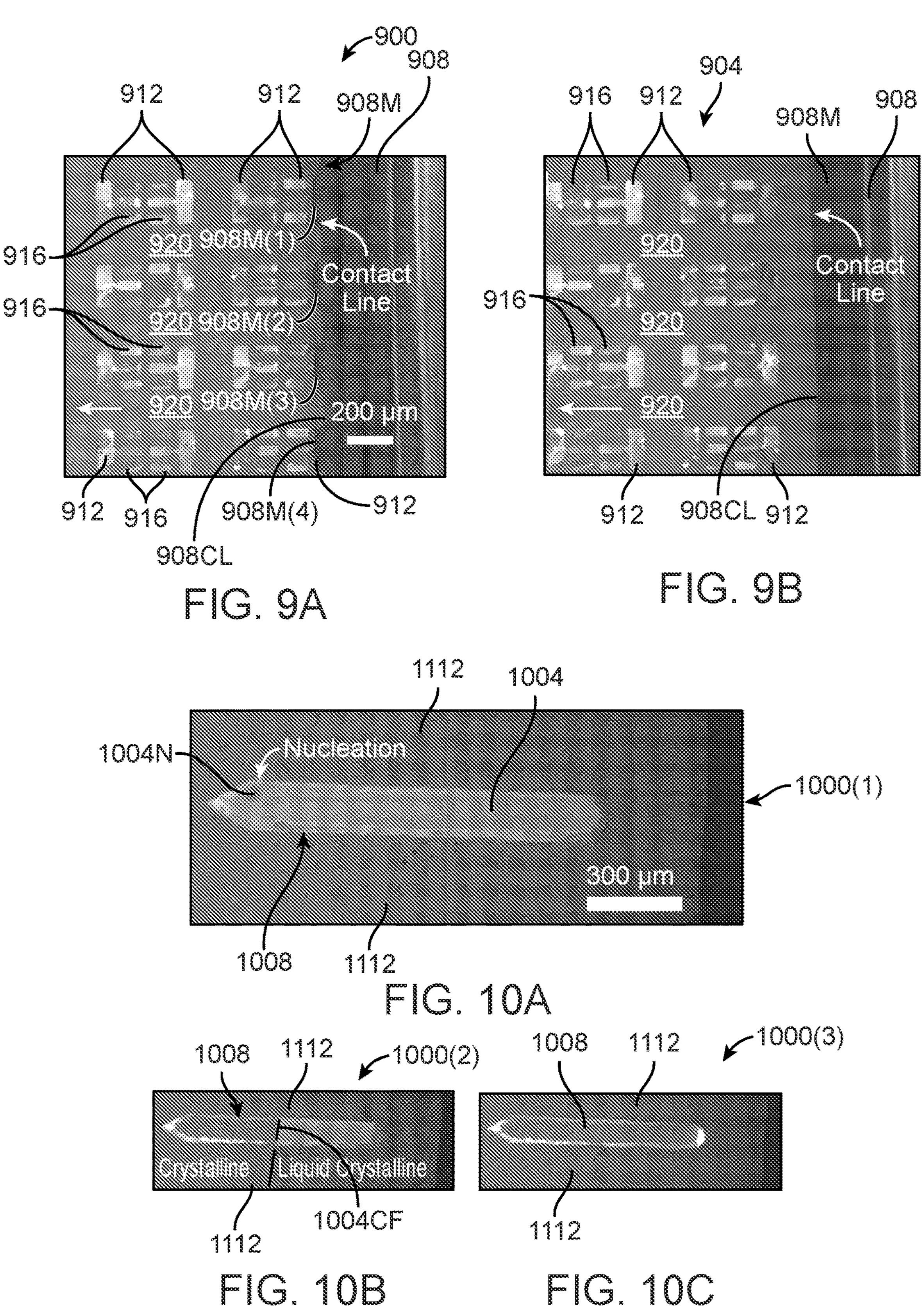
FIG. 9A is a photograph, taken using 45° cross polarizers, of the deposition of a precursor solution in forming a plurality of FETs, showing the interaction of the solution with the hydrophilic and hydrophobic regions.
FIG. 9B is a photograph, taken using 45° cross polarizers, of the deposition of a precursor solution in forming a plurality of FETs, showing the interaction of the solution with only the hydrophobic regions.
FIG. 10A is a photograph of a patterned feature at the initial nucleation of crystallization of the precursor solution written using an FBM dispenser of the present disclosure.
FIG. 10B is a photograph of the patterned feature of FIG. 10A after partial crystallization of the patterned feature.
FIG. 10C is a photograph of the patterned feature of FIGS. 10A and 10B after complete crystallization of the patterned feature.

For example, FIGS. 9A and 9B show two images 900 and 904 taken a short time apart to illustrate the movement of a meniscus 908M of precursor solution 908 being applied to a patterned surface having hydrophilic patterned regions 912 and 916 (only a small number of each labeled to avoid clutter) in which the precursor solution is to be deposited and hydrophobic regions 920 where no precursor solution should be deposited. Comparing FIGS. 9A and 9B with one another, it is readily seen that, in regions 908M(1) to 908M(4) of the meniscus 908M where the precursor solution 908 is still in contact with ones of hydrophilic patterned regions 912, the meniscus is dynamically stretched (see also FIG. 8C) to form a nonlinear contact line 908CL (FIG. 9A), while where the meniscus is in contact with the hydrophobic region the dynamic stretching does not exist because of the much lower wetting forces. Because the meniscus 908M in FIG. 9B has sufficiently passed the last of the hydrophilic patterned regions 912, the contact line 908CL is once again linear because of the now-even distribution of surface tension within the meniscus. In this example, the printed patterned regions 912 and 916 contain crystallized C8-BTBT, and the printing speed was 0.3 mm/s, which is in coating Regime 1.

FIGS. 10A to 10C illustrate printing with nearly perfect contrast and fidelity for small features, such as features equal to or greater than about 200 μm in a largest direction and equal to or less than about 200 μm in a smallest direction, equal to or greater than about 100 μm in a largest direction and equal to or less than about 100 μm in a smallest direction, equal to or greater than about 50 μm in a largest direction and equal to or less than about 50 μm in a smallest direction, or such as features having a largest dimension smaller than 20 μm, among others. These striking results appear to be due to the extreme sensitivity of the coating process to the contact angle of the solution in the meniscus (see above) and whether the meniscus is pinned at the boundary of a hydrophilic region. The methodology also appears to be improved by passive delivery of the solution, which can be facilitated using an FBM dispenser of the present disclosure, such as the FBM dispenser 100 of FIG. 1A and the FBM dispenser 200 of FIGS. 2A to 2D as described above.

FIGS. 10A to 10C show, respectively, three frames 1000 (1) to 1000(3) extracted from a video taken during deposition of patterned C8-BTBT at 80° C. with a writing speed of 25 mm/s from 0.5 wt % toluene solution 1004. Frame 1000(1) of FIG. 10A corresponds to a moment roughly 1 second after the printing stage has stopped with a single patterned feature 1008 in view composed primarily of the solution 1004 at this point in time. The initial nucleation event of the crystalline phase from the liquid crystal phase is visible at 1004N, and the crystallization of the patterned feature 1008 is observed to propagate from left to right in frames 1000(2) and 1000(3) of, respectively, FIGS. 10B and 10C, with the crystallization front 1004CF being shown roughly in the longitudinal center of the patterned feature in frame 1000(2) and the entire patterned feature being fully crystallized in frame 1000(3). These subsequent frames 1000(2) and 1000(3) are separated from one another by about 1 second, and frame 1000(2) is also separated from frame 1000(1) by about 1 second. In this example, the patterned feature is 150 μm by 1 mm. It is notable that this printing occurred in coating Regime 2, wherein small grain thin films would normally be obtained. However, deposition on a heated substrate caused the C8-BTBT to pass through a transient liquid crystalline state, which lead to a large crystalline grain structure. Templating, here provided by hydrophobic regions 1112 surrounding the patterned feature 1008 caused the nucleation of the crystalline phase to occur within the hydrophilic region of the surface (not seen) underlying the patterned feature. Therefore, in this methodology, mono-crystalline domains can be placed in any desired location on a surface by utilizing an appropriate template.

The capability of printing high-quality crystalline features can have significant utility for the creation of electronic devices that are free of grain boundary defects. In particular, FIGS. 10A to 10C demonstrate that the general methodology satisfies all three of the desired attributes described in the Background section above, since it is a low-cost high throughput methodology and large crystalline grain thin films are produced by the patterned printing. Patterning somewhat relaxes the need to obtain very large grain sizes (e.g., >25.4 mm) since the crystalline grains can be placed at the location of a given device, such as an FET. This provides a means to produce a semiconductor layer that is free of grain boundary defects within the region of the device. The methodology is also compatible with methods of obtaining large crystalline grains at a high speed (e.g., >1 mm/s), such as by use of the transient-phase phenomenon shown in FIGS. 10A to 10C for a patterned thin film.

As noted above, patterning may be accomplished through additional means that do not require direct templating of the surface. For example, a sheet mask can be produced where the solid part of the sheet mask has a surface that is hydrophobic. When the sheet mask is engaged with a hydrophilic substrate surface, openings in the sheet mask would allow portions of the hydrophilic surface that is to be coated to be exposed. Assuming that the mask is thin compared to typical dimensions of the meniscus, the sheet mask itself will fulfill the role of the template in the process described above. An advantage of this approach is that the sheet mask can be readily removed, which will facilitate the deposition of multiple layers.

Various modifications and additions can be made without departing from the spirit and scope of this invention. Features of each of the various embodiments described above may be combined with features of other described embodiments as appropriate in order to provide a multiplicity of feature combinations in associated new embodiments. Furthermore, while the foregoing describes a number of separate embodiments, what has been described herein is merely illustrative of the application of the principles of the present invention. Additionally, although particular methods herein may be illustrated and/or described as being performed in a specific order, the ordering is highly variable within ordinary skill to achieve aspects of the present disclosure. Accordingly, this description is meant to be taken only by way of example, and not to otherwise limit the scope of this invention.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. A dispenser for dispensing, along a deposition direction, a solution to a surface when movement occurs between the dispenser and the surface along the deposition direction and when the solution forms a meniscus between the dispenser and the surface, the dispenser comprising:

- a dispensing slot having a slot opening immediately adjacent to the surface when the dispenser is in use, the slot opening having a length at least nominally perpendicular to the deposition direction and a width at least nominally parallel to the deposition direction, wherein the length of the slot opening is at least 2 times the width of the slot opening and the slot opening is continuous and unobstructed along the length of the slot opening; and
- a force-balancing reservoir fluidly communicating with the dispensing slot along the length of the slot opening of the slot and designed and configured to hold a portion of the solution during use of the dispenser, the force-balancing reservoir containing a plurality of wetting features deployed to:
  - allow the solution to flow out of the slot opening when movement exists between the dispenser and the solution in the dispensing direction; and
  - keep the solution from flowing out of the slot opening when no movement exists between the dispenser and the surface in the dispensing direction.

2. The dispenser of claim 1, wherein:

- the dispensing slot has a flow axis along which the solution flows during use of the dispenser;
- the force-balancing reservoir has an aggregate flow axis along which the solution flows in the force-balancing reservoir during use of the dispenser; and
- the flow axis of the dispensing slot is perpendicular relative to the aggregate flow axis of the force-balancing reservoir.

3. The dispenser of claim 1, wherein:

- the dispensing slot has a flow axis along which the solution flows during use of the dispenser;
- the force-balancing reservoir has an aggregate flow axis along which the solution flows in the force-balancing reservoir during use of the dispenser; and
- the flow axis of the dispensing slot is parallel relative to the aggregate flow axis of the force-balancing reservoir.

4. The dispenser of claim 1, wherein:

- the dispensing slot has a flow axis along which the solution flows during use of the dispenser;
- the force-balancing reservoir has an aggregate flow axis along which the solution flows in the force-balancing reservoir during use of the dispenser; and
- the flow axis of the dispensing slot is oblique relative to the aggregate flow axis of the force-balancing reservoir.

5. The dispenser of claim 1, wherein:

- the dispensing slot has a flow axis along which the solution flows during use of the dispenser;
- the force-balancing reservoir has an aggregate flow axis along which the solution flows in the force-balancing reservoir during use of the dispenser;
- the flow axis of the dispensing slot forms an angle, o, relative to the aggregate flow axis of the force-balancing reservoir; and
- the wetting features are deployed as a function of the angle d.

6. The dispenser of claim 1, wherein the dispenser is designed and configured so that the force-balancing reservoir and the slot opening are both open to ambient atmosphere surrounding the dispenser during use.

7. The dispenser of claim 1, wherein the force-balancing reservoir is configured as an open channel having a lower wall, and the wetting features are deployed on the lower wall.

8. The dispenser of claim 7, further comprising a transparent closure removably engaged with the open channel so as to allow a user to view the contents of the force-balancing reservoir.

9. The dispenser of claim 1, wherein the wetting features are provided as an insert structure inserted to the force-balancing reservoir.

10. The dispenser of claim 1, wherein the wetting features have an aggregate volume that defines a volume of the force-balancing reservoir.

11. The dispenser of claim 1, wherein the wetting features comprise interconnected open pores.

12. The dispenser of claim 1, wherein the wetting features comprise columnar structures within the force-balancing reservoir.

13. The dispenser of claim 1, wherein the wetting features comprise a plurality of open channels.

14. The dispenser of claim 1, wherein the wetting features comprise a plurality of closed channels.

15. The dispenser of claim 1, wherein the wetting features have hydrophilic surfaces located so as to be in contact with the solution during use.

* * * * *